(12) United States Patent
Seino et al.

(10) Patent No.: US 7,495,868 B2
(45) Date of Patent: Feb. 24, 2009

(54) EXCHANGE COUPLING FILM AND MAGNETIC SENSING ELEMENT INCLUDING THE SAME

(75) Inventors: Takuya Seino, Tokyo (JP); Fumihito Koike, Tokyo (JP); Naoya Hasegawa, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 318 days.

(21) Appl. No.: 11/180,012

(22) Filed: Jul. 12, 2005

(65) Prior Publication Data

US 2006/0012927 A1 Jan. 19, 2006

(30) Foreign Application Priority Data

Jul. 14, 2004 (JP) ............... 2004-206889

(51) Int. Cl.
*G11B 5/39* (2006.01)

(52) U.S. Cl. ................ 360/324.11

(58) Field of Classification Search ......... 360/314, 360/324, 324.1, 324.11, 324.2; 29/603.07; 204/192.2; 428/611
See application file for complete search history.

(56) References Cited

U.S. PATENT DOCUMENTS

| 6,802,114 B2* | 10/2004 | Gill | 29/603.07 |
| 6,807,033 B2* | 10/2004 | Zhu | 360/324 |
| 6,866,751 B2* | 3/2005 | Gill et al. | 204/192.2 |
| 6,905,780 B2* | 6/2005 | Yuasa et al. | 428/611 |
| 2002/0135952 A1* | 9/2002 | Gill | 360/324.11 |
| 2005/0219770 A1* | 10/2005 | Gill | 360/324.2 |
| 2005/0243476 A1* | 11/2005 | Gill | 360/324.11 |
| 2006/0002033 A1* | 1/2006 | Gill | 360/324 |

FOREIGN PATENT DOCUMENTS

| JP | 9-148132 | 6/1997 |
| JP | 9-237716 | 9/1997 |
| JP | 10-313138 | 11/1998 |
| JP | 11-144956 | 5/1999 |
| JP | 11-346017 | 12/1999 |
| JP | 2000-30225 | 1/2000 |
| JP | 2001-217480 | 8/2001 |
| JP | 2002-208120 | 7/2002 |
| JP | 2003-133614 | 5/2003 |
| JP | 2003-317215 | 11/2003 |

* cited by examiner

*Primary Examiner*—Tianjie Chen
(74) *Attorney, Agent, or Firm*—Brinks Hofer Gilson & Lione

(57) ABSTRACT

A magnetic sensing element and exchange coupling film is disclosed. The magnetic sensing element has a free magnetic layer, nonmagnetic material layers disposed on the top and bottom of the free magnetic layer, pinned magnetic layers disposed on the top of one nonmagnetic material layer and on the bottom of the other nonmagnetic material layer, and antiferromagnetic layers containing IrMn disposed on the top of one pinned magnetic layer and on the bottom of the other pinned magnetic layer. The magnetization of the free magnetic layer is aligned in a direction orthogonal to the magnetization direction of the pinned magnetic layers. The exchange coupling film is formed by the antiferromagnetic layer and the pinned magnetic layer above the free magnetic layer. At least an interfacial portion of the ferromagnetic layer which is adjacent to the antiferromagnetic layer contains $Co_{100-x}Fe_x$ wherein $30\% \leq x \leq 90\%$ in atomic percent.

10 Claims, 6 Drawing Sheets

(EXAMPLE 1)
 □ (TOP-SV) IrMn Co70 Fe30=14Å

(COMPARATIVE EXAMPLE 1)
 ● (BOTTOM-SV) IrMn Co90 Fe10=16Å

(COMPARATIVE EXAMPLE 2)
 ■ (BOTTOM-SV) PtMn Pin1:Co90 Fe10=16Å

EXCHANGE COUPLING FILM AND MAGNETIC SENSING ELEMENT INCLUDING THE SAME

This application claims the benefit of priority to Japanese Patent Application No. 2004-206889, filed on Jul. 14, 2004, herein incorporated by reference.

BACKGROUND OF THE INVENTION

1. Field of the Invention

The present invention relates to exchange coupling films including an antiferromagnetic layer and a ferromagnetic layer between which an exchange coupling field ($H_{ex}$) occurs to align the magnetization of the ferromagnetic layer in a predetermined direction, and also to magnetic sensing elements including the exchange coupling films. In particular, the present invention relates to an exchange coupling film including a ferromagnetic layer made of CoFe and an antiferromagnetic layer made of IrMn to provide a larger exchange coupling field ($H_{ex}$), and also to a magnetic sensing element including the exchange coupling film.

2. Description of the Related Art

FIG. 6 is a partial sectional view of a conventional magnetic sensing element (spin-valve thin-film element), taken along a plane parallel to a surface facing a recording medium.

In FIG. 6, a seed layer 14 is made of, for example, NiFeCr. An antiferromagnetic layer 30, a pinned magnetic layer 31, a nonmagnetic material layer 32, a free magnetic layer 33, and a protective layer 7 are sequentially formed on the seed layer 14.

This type of spin-valve thin-film element generates an exchange coupling field between the antiferromagnetic layer 30 and the pinned magnetic layer 31 by performing heat treatment to pin the magnetization of the pinned magnetic layer 31 in the height direction (the Y direction in the drawing).

Hard bias layers 5 are formed on the sides of the multilayer film including the above layers. These hard bias layers 5 generate a longitudinal bias field to align the magnetization of the free magnetic layer 33 in a track width direction (the X direction in the drawing).

Electrode layers 8 are formed on the hard bias layers 5. These electrode layers 8 allow a sense current to flow mainly through the pinned magnetic layer 31, the nonmagnetic material layer 32, and the free magnetic layer 33.

The antiferromagnetic layer 30 is made of IrMn while the pinned magnetic layer 31 is made of CoFe. This type of magnetic sensing elements are disclosed in Japanese Unexamined Patent Application Publication Nos. 9-237716 (Page 7 and FIG. 10 of the publication), 9-148132 (Page 8 and FIG. 10 of the publication), and 2002-208120 (Page 11 of the publication).

The above publications disclose magnetic sensing elements including an antiferromagnetic layer made of IrMn and a pinned magnetic layer (ferromagnetic layer) made of CoFe, though the composition of CoFe disclosed is only $Co_{90}Fe_{10}$. If a pinned magnetic layer made of $Co_{90}Fe_{10}$ is formed on an antiferromagnetic layer made of PtMn, a sufficiently large exchange coupling field occurs to pin the magnetization of the pinned magnetic layer. If, however, the antiferromagnetic layer is made of IrMn, the exchange coupling field is small. This results in a higher possibility of inversion of the magnetization of the pinned magnetic layer in a process of producing a magnetic sensing element. This problem is serious particularly for top spin-valve giant magnetoresistive (GMR) elements, in which an antiferromagnetic layer is formed on a pinned magnetic layer.

SUMMARY OF THE INVENTION

Accordingly, an object of the present invention is to provide an exchange coupling film including an antiferromagnetic layer made of IrMn and a pinned magnetic layer (ferromagnetic layer) made of CoFe to generate a larger exchange coupling field and thus reduce the possibility of inversion of the magnetization of the pinned magnetic layer, and also provide a magnetic sensing element including the exchange coupling film.

The present invention provides an exchange coupling film including an antiferromagnetic layer formed on a ferromagnetic layer. An exchange coupling field occurs between the two layers to align the magnetization of the ferromagnetic layer in a predetermined direction. The antiferromagnetic layer is made of IrMn, and at least an interfacial portion of the ferromagnetic layer which is adjacent to the antiferromagnetic layer is made of $Co_{100-x}Fe_x$ wherein $30\% \leq x \leq 90\%$ in atomic percent.

The present invention is based on the finding that, if an exchange coupling film is formed which includes an antiferromagnetic layer made of IrMn and a ferromagnetic layer made of CoFe and formed on the bottom thereof, the composition of CoFe must be adjusted within a different range from conventional compositions.

For such an exchange coupling film, as in the present invention, at least an interfacial portion of the ferromagnetic layer which is adjacent to the antiferromagnetic layer may be made of $Co_{100-x}Fe_x$ wherein $30\% \leq x \leq 90\%$ in atomic percent to achieve a larger exchange coupling field between the antiferromagnetic layer and the ferromagnetic layer.

In the present invention, at least the interfacial portion of the ferromagnetic layer which is adjacent to the antiferromagnetic layer is preferably made of $Co_{100-x}Fe_x$ wherein $35\% \leq x \leq 80\%$ in atomic percent. If a pinned magnetic layer made of a CoFe alloy having the above composition is used to form the exchange coupling film according to the present invention, the exchange coupling film can provide an exchange coupling field of 64 kA/m or more. If the exchange coupling field is 64 kA/m or more, the rate of magnetic sensing elements having a pinned magnetic layer with inverted magnetization may be reduced to 5% or less.

In the present invention, at least the interfacial portion of the ferromagnetic layer which is adjacent to the antiferromagnetic layer is more preferably made of $Co_{100-x}Fe_x$ wherein $40\% \leq x \leq 60\%$ in atomic percent. If a pinned magnetic layer made of a CoFe alloy having the above composition is used to form the exchange coupling film according to the present invention, the exchange coupling film can provide an exchange coupling field of 80 kA/m or more.

The present invention is effective particularly if the antiferromagnetic layer has a thickness of 30 to 80 Å.

The present invention further provides a magnetic sensing element (top spin-valve GMR magnetic sensing element) including, from the bottom, a free magnetic layer, a nonmagnetic material layer, a pinned magnetic layer, and an antiferromagnetic layer. The magnetization of the free magnetic layer is aligned in a direction orthogonal to the magnetization direction of the pinned magnetic layer. The pinned magnetic layer and the antiferromagnetic layer are made of the above exchange coupling film according to the present invention.

The present invention further provides another magnetic sensing element (dual spin-valve GMR magnetic sensing element) including a free magnetic layer, nonmagnetic material layers disposed on the top and bottom of the free magnetic layer, pinned magnetic layers disposed on the top of one nonmagnetic material layer and on the bottom of the other nonmagnetic material layer, and antiferromagnetic layers disposed on the top of one pinned magnetic layer and on the bottom of the other pinned magnetic layer. The magnetization of the free magnetic layer is aligned in a direction orthogonal to the magnetization direction of the pinned magnetic layers. The antiferromagnetic layer and the pinned magnetic layer above the free magnetic layer are made of the above exchange coupling film according to the present invention.

If the antiferromagnetic layer below the free magnetic layer in the dual spin-valve GMR magnetic sensing element is made of IrMn, at least an interfacial portion of the pinned magnetic layer below the free magnetic layer which is adjacent to the antiferromagnetic layer may be made of $Co_{100-x}Fe_x$ wherein $10\% \leq x \leq 90\%$ in atomic percent to achieve a larger exchange coupling field between the antiferromagnetic layer and the pinned magnetic layer below the free magnetic layer. In particular, at least the interfacial portion of the pinned magnetic layer below the free magnetic layer which is adjacent to the antiferromagnetic layer is more preferably made of $Co_{100-x}Fe_x$ wherein $10\% \leq x \leq 30\%$ in atomic percent.

As described above, the pinned magnetic layers above and below the free magnetic layer may be made of CoFe alloys having different compositions to separately maximize the exchange coupling fields of the exchange coupling films above and below the free magnetic layer.

In the present invention, preferably, the pinned magnetic layer above the free magnetic layer has a multilayer ferrimagnetic structure including a first magnetic layer adjacent to the antiferromagnetic layer above the free magnetic layer, a second magnetic layer, and a nonmagnetic intermediate layer disposed between the first and second magnetic layers, and the antiferromagnetic layer and the first magnetic layer are made of the above exchange coupling film.

In addition, the free magnetic layer may have a multilayer ferrimagnetic structure including a first magnetic layer, a second magnetic layer, and a nonmagnetic intermediate layer disposed therebetween.

For an exchange coupling film including a ferromagnetic layer disposed on the bottom of an antiferromagnetic layer, according the present invention, the ferromagnetic layer may be made of $Co_{100-x}Fe_x$ wherein $30\% \leq x \leq 90\%$ in atomic percent to achieve a larger exchange coupling field between the antiferromagnetic layer and the ferromagnetic layer.

In particular, if the ferromagnetic layer is made of $Co_{100-x}Fe_x$ wherein $35\% \leq x \leq 80\%$ in atomic percent, the exchange coupling film can provide an exchange coupling field of 64 kA/m or more. Using the exchange coupling film to produce magnetic sensing elements, the rate of defective magnetic sensing elements due to the magnetization inversion of the pinned magnetic layer may be reduced to 5% or less.

DESCRIPTION OF THE PREFERRED EMBODIMENTS

Figure 1:
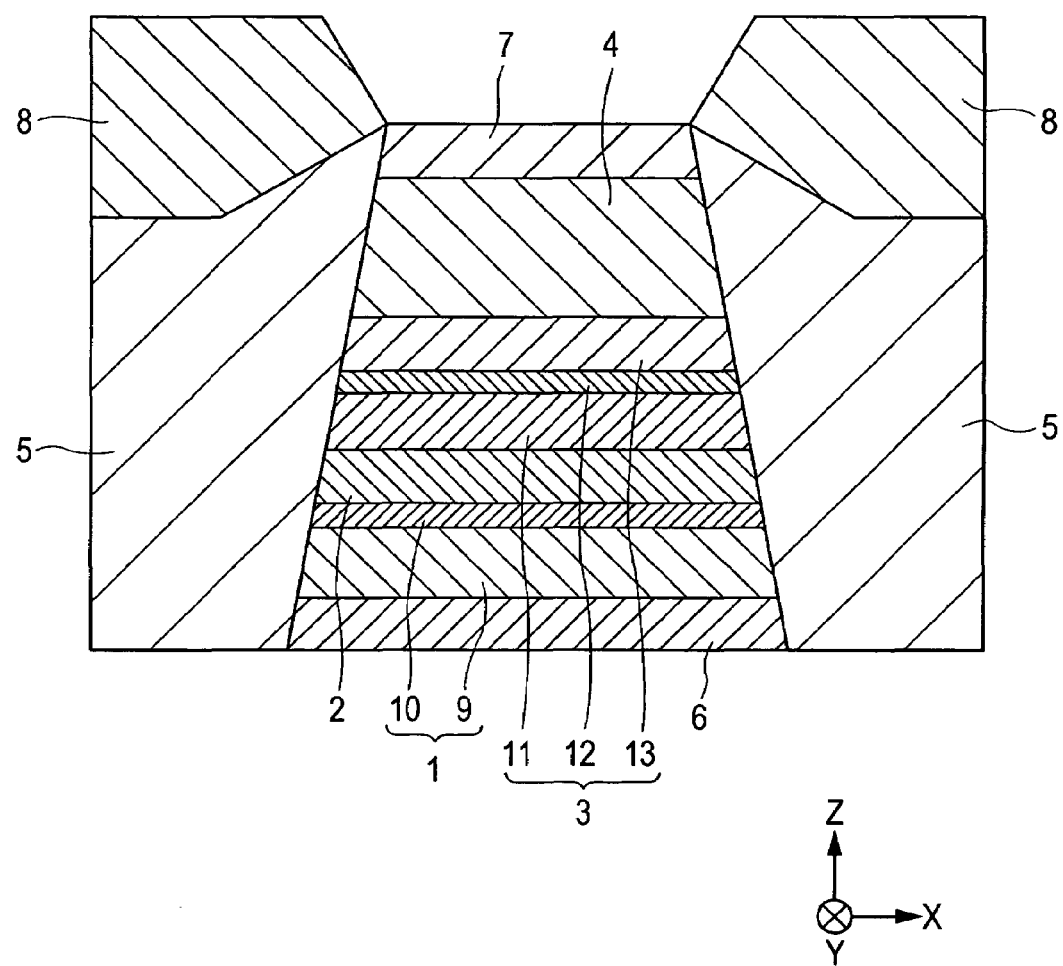
FIG. 1 is a sectional view from the recording medium side of a magnetic sensing element (top spin-valve magnetoresistive element) according to a first embodiment of the present invention.

FIG. 1 is a partial sectional view from the recording medium side of a magnetic sensing element (single spin-valve magnetoresistive element) according to a first embodiment of the present invention, showing only the center of the element in the X direction.

This single spin-valve magnetoresistive element is disposed on, for example, a trailing end of a floating slider provided to a hard disc drive to sense a recording field from, for example, a hard disc. A magnetic recording medium such as a hard disc moves in the Z direction, and a magnetic field leaks from the magnetic recording medium in the Y direction.

The bottom layer in FIG. 1 is a base layer 6 made of a nonmagnetic material such as one or more elements selected from the group consisting of Ta, Hf, Nb, Zr, Ti, Mo, and W. This base layer 6 has a thickness of, for example, about 50 Å.

A free magnetic layer 1 is formed on the base layer 6, and includes a NiFe alloy film 9 and a CoFe film 10. As shown in FIG. 1, the CoFe film 10 is formed so as to come in contact with a nonmagnetic material layer 2. This CoFe film 10 can inhibit the diffusion of, for example, metal elements at the interface between the free magnetic layer 1 and the nonmagnetic material layer 2 to increase the rate of change in resistance ($\Delta R/R$).

The NiFe alloy film 9 contains, for example, 80 atomic percent of Ni and 20 atomic percent of Fe, and has a thickness of, for example, about 45 Å. The CoFe film 10 contains, for example, 90 atomic percent of Co and 10 atomic percent of Fe, and has a thickness of, for example, about 5 Å. The NiFe alloy film 9 and the CoFe film 10 may also be replaced by, for example, a Co alloy film and a CoFeNi alloy film, respectively. In addition, the free magnetic layer 1 may also be a single layer of magnetic material. In such a case, the free magnetic layer 1 is preferably made of a CoFeNi alloy. Alternatively, the free magnetic layer 1 may have a multilayer ferrimagnetic structure including magnetic layers and a nonmagnetic intermediate layer disposed therebetween.

A seed layer may be formed between the base layer 6 and the free magnetic layer 1. This seed layer is made of, for example, a NiFeCr alloy, a NiCr alloy, or Cr. The seed layer can increase the size of crystal grains in a direction parallel to the surfaces of the individual layers formed thereon to achieve improvements in, for example, electrification reliability typified by electromigration resistance and the rate of change in resistance ($\Delta R/R$).

The nonmagnetic material layer 2 is formed on the free magnetic layer 1. This nonmagnetic material layer 2 is made of, for example, Cu. If the magnetic sensing element according to the present invention is a tunneling magnetoresistive (TMR) element, which is based on a tunneling effect, the nonmagnetic material layer 2 is made of, for example, an insulating material such as $Al_2O_3$.

A pinned magnetic layer 3 is formed on the nonmagnetic material layer 2. This pinned magnetic layer 3 has a three-layer structure including a second magnetic layer 11 adjacent to the nonmagnetic material layer 2, a nonmagnetic intermediate layer 12, and a first magnetic layer 13. The materials and structure of the pinned magnetic layer 3 will be described later in detail.

An antiferromagnetic layer 4 is made of an IrMn alloy, which has excellent properties as an antiferromagnetic material, namely has a relatively high blocking temperature with less low-temperature components and provides a large exchange coupling field ($H_{ex}$). In addition, a larger exchange coupling field occurs between a ferromagnetic layer and an antiferromagnetic layer made of an IrMn alloy than between a ferromagnetic layer and an antiferromagnetic layer made of a PtMn alloy if the antiferromagnetic layers have a small thickness, namely 30 to 80 Å.

In the present invention, the antiferromagnetic layer 4 preferably contains 15 to 30 atomic percent of Ir.

A protective layer 7 is formed on the antiferromagnetic layer 4. This protective layer 7 is made of, for example, Ta, and may have an oxide layer formed thereon.

In the embodiment shown in FIG. 1, hard bias layers 5 and electrode layers 8 are formed on the sides of the multilayer film including the above layers. The hard bias layers 5 generate a longitudinal bias field to align the magnetization of the free magnetic layer 1 in a track width direction (the X direction in the drawing).

The hard bias layers 5 are made of, for example, a CoPt alloy or a CoCrPt alloy. The electrode layers 8 are made of, for example, α-Ta, Au, Ru, Cr, Cu, or W. For a tunneling magnetoresistive element or a CPP magnetic sensing element, the electrode layers 8 are formed on the bottom of the free magnetic layer 1 and on the top of the antiferromagnetic layer 4.

The magnetic sensing element shown in FIG. 1 is a top spin-valve GMR element in which the free magnetic layer 1 is formed below the antiferromagnetic layer 4.

In the present invention, as described above, the pinned magnetic layer 3 has a multilayer ferrimagnetic structure. The antiferromagnetic layer 4 and the first magnetic layer (ferromagnetic layer) 13 constitute an exchange coupling film according to the present invention.

The first magnetic layer 13, which is adjacent to the antiferromagnetic layer 4, has the following feature in film composition.

The first magnetic layer (ferromagnetic layer) 13 is made of $Co_{100-x}Fe_x$ wherein $30\% \leq x \leq 90\%$ in atomic percent.

If the antiferromagnetic layer 4 is formed on the first magnetic layer 13, the content of Fe in the CoFe alloy for the first magnetic layer 13 may be adjusted to 30 atomic percent or more to achieve a larger exchange coupling field between the antiferromagnetic layer 4 and the first magnetic layer 13. On the other hand, the content of Fe in the CoFe alloy is adjusted to 90 atomic percent or less because an excessive content of Fe decreases the exchange coupling field.

If, additionally, the first magnetic layer 13 is made of $Co_{100-x}Fe_x$ wherein $35\% \leq x \leq 80\%$ in atomic percent, an exchange coupling field of 64 kA/m or more may be achieved between the antiferromagnetic layer 4 and the first magnetic layer 13. If the exchange coupling field is 64 kA/m or more, the rate of defective magnetic sensing elements due to the magnetization inversion of the pinned magnetic layer 3 may be reduced to 5% or less.

If, furthermore, the first magnetic layer 13 is made of $Co_{100-x}Fe_x$ wherein $40\% \leq x \leq 60\%$ in atomic percent, an exchange coupling field of 80 kA/m or more may be achieved between the antiferromagnetic layer 4 and the first magnetic layer 13.

In the present invention, at least an interfacial portion of the first magnetic layer 13 which is adjacent to the antiferromagnetic layer 4 falls within the above composition ranges.

The second magnetic layer 11 is preferably made of a CoFe alloy to enhance a coupling field due to the RKKY interaction between the first magnetic layer 13 and the second magnetic layer 11 so that the magnetization of the second magnetic layer 11 can be properly pinned.

In the present invention, however, the material for the second magnetic layer 11 is not limited to a CoFe alloy; the second magnetic layer 11 may also be made of a magnetic material such as a CoFeNi alloy, Co, and a NiFe alloy.

Because the pinned magnetic layer 3 has a multilayer ferrimagnetic structure in the present invention, the first magnetic layer 13 preferably has a different magnetic moment per unit area (saturation magnetization Ms×thickness t) from that of the second magnetic layer 11 to provide a proper multilayer ferrimagnetic state.

Such a multilayer ferrimagnetic structure can provide a coupling field due to the RKKY interaction between the first magnetic layer 13 and the second magnetic layer 11 to align the magnetization of the first magnetic layer 13 and the second magnetic layer 11 properly in antiparallel.

The nonmagnetic intermediate layer 12, which is disposed between the first magnetic layer 13 and the second magnetic layer 11, is preferably made of one or more metals selected from the group consisting of Ru, Rh, Ir, Os, Cr, Re, and Cu. Among them, the nonmagnetic intermediate layer 12 is more preferably made of Ru in the present invention. Such a nonmagnetic intermediate layer 12 can enhance the coupling field due to the RKKY interaction between the first magnetic layer 13 and the second magnetic layer 11 to align the magnetization of the first magnetic layer 13 and the second magnetic layer 11 properly in antiparallel.

The above film structure can enhance the unidirectional exchange bias field ($H_{ex}*$) of the pinned magnetic layer 3 to properly pin the pinned magnetic layer 3 and inhibit variations in the magnetization direction thereof in a production process, thus properly improving electrification reliability typified by ESD resistance and electromigration resistance.

In the present invention, additionally, the antiferromagnetic layer 4 is made of an IrMn alloy. Even if the antiferromagnetic layer 4 has a small thickness, namely 30 to 80 Å, an exchange coupling field can be generated at a practical level between the antiferromagnetic layer 4 and the first magnetic layer 13 of the pinned magnetic layer 3. Accordingly, the amount of sense current shunted from the electrode layers 8 into the antiferromagnetic layer 4, namely a shunt loss, can be reduced to improve the rate of change in resistance ($\Delta R/R$).

Figure 2:
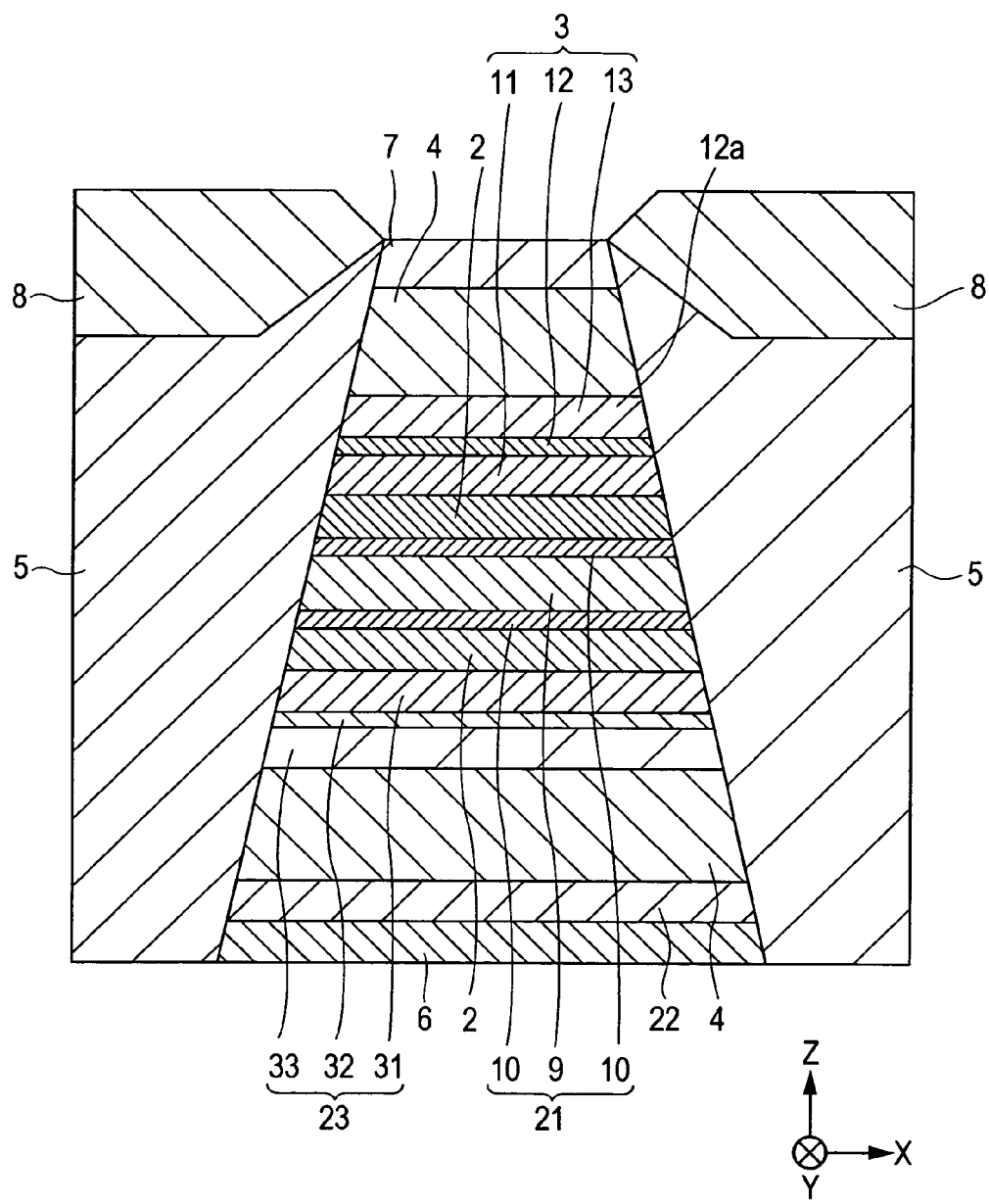
FIG. 2 is a sectional view from the recording medium side of a magnetic sensing element (dual spin-valve magnetoresistive element) according to a second embodiment of the present invention.

FIG. 2 is a partial sectional view from the recording medium side of another magnetic sensing element (dual spin-valve magnetoresistive element) according to the present invention.

In FIG. 2, a base layer 6, a seed layer 22, an antiferromagnetic layer 4, a pinned magnetic layer 23, a nonmagnetic material layer 2, and a free magnetic layer 21 are sequentially formed in the above order. In addition, another nonmagnetic material layer 2, another pinned magnetic layer 3, another antiferromagnetic layer 4, and a protective layer 7 are sequentially formed on the free magnetic layer 21.

Hard bias layers 5 and electrode layers 8 are formed on the sides of the multilayer film including the above layers. In this embodiment, the seed layer 22 is formed on the base layer 6. This seed layer 22 can increase the size of crystal grains in a direction parallel to the surfaces of the individual layers formed thereon to achieve improvements in, for example, electrification reliability typified by electromigration resistance and the rate of change in resistance ($\Delta R/R$).

The seed layer 22 is made of, for example, a NiFeCr alloy, a NiCr alloy, or Cr. The NiFeCr alloy used for the seed layer 22 contains, for example, 60 atomic percent of $Ni_{0.8}Fe_{0.2}$ and 40 atomic percent of Cr.

The free magnetic layer 21 has a three-layer structure including, for example, CoFe films 10 and a NiFe alloy film 9.

The pinned magnetic layer 23 has a multilayer ferrimagnetic structure including, from the bottom, a first magnetic layer 33, a nonmagnetic intermediate layer 32, and a second magnetic layer 31.

The base layer 6, the antiferromagnetic layers 4, the pinned magnetic layer 3, the nonmagnetic material layers 2, and the protective layer 7 are made of the same materials and have the same thicknesses as the layers indicated by the same reference numerals in the magnetic sensing element shown in FIG. 1.

The antiferromagnetic layer 4 above the free magnetic layer 21 is made of an IrMn alloy and is formed on the first magnetic layer 13 of the pinned magnetic layer 3. In this case, the content of Fe in the CoFe alloy for the first magnetic layer 13 may be adjusted to 30 atomic percent or more to achieve a larger exchange coupling field between the antiferromagnetic layer 4 and the first magnetic layer 13. On the other hand, the content of Fe in the CoFe alloy is adjusted to 90 atomic percent or less because an excessive content of Fe decreases the exchange coupling field.

If, additionally, the first magnetic layer 13 is made of $Co_{100-x}Fe_x$ wherein $35\% \leq x \leq 80\%$ in atomic percent, an exchange coupling field of 64 kA/m or more may be achieved between the antiferromagnetic layer 4 and the first magnetic layer 13. If the exchange coupling field is 64 kA/m or more, the rate of defective magnetic sensing elements due to the magnetization inversion of the pinned magnetic layer 3 may be reduced to 5% or less.

If, furthermore, the first magnetic layer 13 is made of $Co_{100-x}Fe_x$ wherein $40\% \leq x \leq 60\%$ in atomic percent, an exchange coupling field of 80 kA/m or more may be achieved between the antiferromagnetic layer 4 and the first magnetic layer 13.

In the present invention, at least an interfacial portion of the first magnetic layer 13 which is adjacent to the antiferromagnetic layer 4 falls within the above composition ranges.

The second magnetic layer 11 is preferably made of a CoFe alloy, for example $Co_{90}Fe_{10}$, to enhance a coupling field due to the RKKY interaction between the first magnetic layer 13 and the second magnetic layer 11 so that the magnetization of the second magnetic layer 11 can be properly pinned.

In the present invention, however, the material for the second magnetic layer 11 is not limited to a CoFe alloy; the second magnetic layer 11 may also be made of a magnetic material such as a CoFeNi alloy, Co, and a NiFe alloy.

Because the pinned magnetic layer 3 has a multilayer ferrimagnetic structure in the present invention, the first magnetic layer 13 preferably has a different magnetic moment per unit area (saturation magnetization Ms×thickness t) from that of the second magnetic layer 11 to provide a proper multilayer ferrimagnetic state.

Such a multilayer ferrimagnetic structure can provide a coupling field due to the RKKY interaction between the first magnetic layer 13 and the second magnetic layer 11 to align the magnetization of the first magnetic layer 13 and the second magnetic layer 11 properly in antiparallel.

The nonmagnetic intermediate layer 12, which is disposed between the first magnetic layer 13 and the second magnetic layer 11, is preferably made of one or more metals selected from the group consisting of Ru, Rh, Ir, Os, Cr, Re, and Cu. Among them, the nonmagnetic intermediate layer 12 is more preferably made of Ru in the present invention. Such a nonmagnetic intermediate layer 12 can enhance the coupling field due to the RKKY interaction between the first magnetic layer 13 and the second magnetic layer 11 to align the magnetization of the first magnetic layer 13 and the second magnetic layer 11 properly in antiparallel.

The above film structure can enhance the unidirectional exchange bias field ($H_{ex}*$) of the pinned magnetic layer 3 to properly pin the pinned magnetic layer 3 and inhibit variations in the magnetization direction thereof in a production process, thus properly improving electrification reliability typified by ESD resistance and electromigration resistance.

In the present invention, additionally, the antiferromagnetic layer 4 is made of an IrMn alloy. Even if the antiferromagnetic layer 4 has a small thickness, namely 30 to 80 Å, an exchange coupling field can be generated at a practical level between the antiferromagnetic layer 4 and the first magnetic layer 13 of the pinned magnetic layer 3. Accordingly, the amount of sense current shunted from the electrode layers 8 into the antiferromagnetic layer 4, namely a shunt loss, can be reduced to improve the rate of change in resistance ($\Delta R/R$).

In this embodiment, furthermore, the antiferromagnetic layer 4 below the free magnetic layer 21 is made of an IrMn alloy, and the first magnetic layer 33 of the pinned magnetic layer 23 below the free magnetic layer 21 is made of $Co_{100-x}Fe_x$ wherein $10\% \leq x \leq 90\%$ in atomic percent.

This results in a larger exchange coupling field between the antiferromagnetic layer 4 and the first magnetic layer 33 below the free magnetic layer 21. The first magnetic layer 33 is more preferably made of $Co_{100-x}Fe_x$ wherein $10\% \leq x \leq 30\%$ in atomic percent.

Similarly to the nonmagnetic intermediate layer 12, the nonmagnetic intermediate layer 32 is preferably made of one or more metals selected from the group consisting of Ru, Rh, Ir, Os, Cr, Re, and Cu. Among them, the nonmagnetic intermediate layer 32 is more preferably made of Ru.

In the present invention, at least an interfacial portion of the first magnetic layer 33 which is adjacent to the antiferromagnetic layer 4 falls within the above composition ranges.

Similarly to the second magnetic layer 11, the second magnetic layer 31 may be made of a magnetic material such as a CoFe alloy, a CoFeNi alloy, Co, and a NiFe alloy.

Because the pinned magnetic layer 23 has a multilayer ferrimagnetic structure in the present invention, the first magnetic layer 33 preferably has a different magnetic moment per unit area (saturation magnetization Ms×thickness t) from that of the second magnetic layer 31 to provide a proper multilayer ferrimagnetic state.

Such a multilayer ferrimagnetic structure can provide a coupling field due to the RKKY interaction between the first magnetic layer 33 and the second magnetic layer 31 to align the magnetization the first magnetic layer 33 and the second magnetic layer 31 properly in antiparallel.

For the dual spin-valve magnetic sensing element shown in FIG. 2, the first magnetic layers 13 and 33 of the pinned magnetic layers 3 and 23 above and below the free magnetic layer 21 may be made of CoFe alloys having different compositions. This magnetic sensing element can therefore separately maximize the exchange coupling field occurring between the pinned magnetic layer 3 and the antiferromagnetic layer 4 above the free magnetic layer 21 and that occurring between the pinned magnetic layer 23 and the antiferromagnetic layer 4 below the free magnetic layer 21.

As shown in FIGS. 1 and 2, the pinned magnetic layer 3 has a multilayer ferrimagnetic structure including the first magnetic layer 13, the nonmagnetic intermediate layer 12, and the second magnetic layer 11, and the pinned magnetic layer 23 has a multilayer ferrimagnetic structure including the first magnetic layer 33, the nonmagnetic intermediate layer 32, and the second magnetic layer 31. Either or both of the pinned magnetic layers 3 and 23 may also be made of a monolayer ferromagnetic film made of CoFe.

EXAMPLE 1

GMR magnetic sensing elements were produced to examine variations in exchange coupling field occurring between an antiferromagnetic layer and a pinned magnetic layer in response to changes in the thickness of the antiferromagnetic layer.

A top spin-valve magnetic sensing element of Example 1 includes a substrate, a seed layer made of NiFeCr and having a thickness of 50 Å, a free magnetic layer including a NiFe film having a thickness of 50 Å and a $Co_{90}Fe_{10}$ film having a thickness of 10 Å, a nonmagnetic material layer made of Cu and having a thickness of 40 Å, a pinned magnetic layer made of $Co_{70}Fe_{30}$ and having a thickness of 14 Å, an antiferromagnetic layer made of IrMn and having a thickness of x Å, and a protective layer made of Ta and having a thickness of 30 Å.

A bottom spin-valve magnetic sensing element of Comparative Example 1 includes a substrate, a seed layer made of NiFeCr and having a thickness of 50 Å, an antiferromagnetic layer made of IrMn and having a thickness of x Å, a pinned magnetic layer made of $Co_{90}Fe_{10}$ and having a thickness of 16 Å, a nonmagnetic material layer made of Cu and having a thickness of 40 Å, a free magnetic layer including a $Co_{90}Fe_{10}$ film having a thickness of 10 Å and a NiFe film having a thickness of 50 Å, and a protective layer made of Ta and having a thickness of 30 Å.

A bottom spin-valve magnetic sensing element of Comparative Example 2 includes a substrate, a seed layer made of NiFeCr and having a thickness of 50 Å, an antiferromagnetic layer made of PtMn and having a thickness of x Å, a pinned magnetic layer made of $Co_{90}Fe_{10}$ and having a thickness of 16 Å, a nonmagnetic material layer made of Cu and having a thickness of 40 Å, a free magnetic layer including a $Co_{90}Fe_{10}$ film having a thickness of 10 Å and a NiFe film having a thickness of 50 Å, and a protective layer made of Ta and having a thickness of 30 Å.

Figure 3:
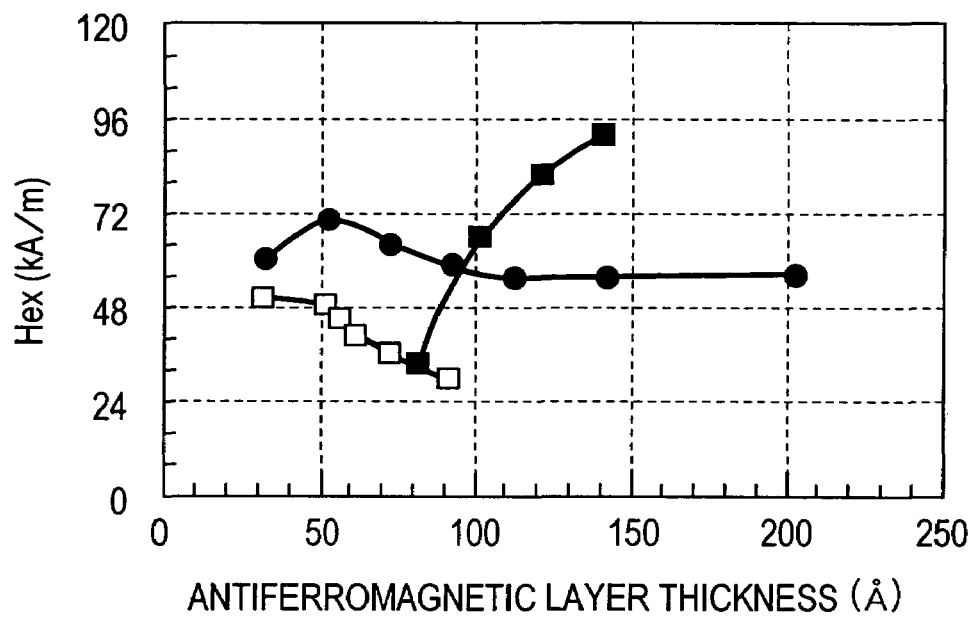
FIG. 3 is a graph showing variations in exchange coupling field occurring between an antiferromagnetic layer and a pinned magnetic layer in response to changes in the thickness of the antiferromagnetic layer.

The results are shown in FIG. 3. The magnetic sensing element of Comparative Example 2 includes an exchange coupling film including the antiferromagnetic layer made of PtMn and the pinned magnetic layer made of $Co_{90}Fe_{10}$ formed thereon. This magnetic sensing element can generate an exchange coupling field close to 96 kA/m between the antiferromagnetic layer and the pinned magnetic layer when the antiferromagnetic layer has a thickness of 140 Å. The exchange coupling field, however, decreases sharply as the thickness of the antiferromagnetic layer is reduced.

If the antiferromagnetic layer is made of IrMn, the exchange coupling field does not decrease with decreasing thickness of the antiferromagnetic layer in the range of 50 Å or more. The exchange coupling field increases with decreasing thickness of the antiferromagnetic layer in the range of 110 to 50 Å, and exhibits no sharp decrease even if the thickness of the antiferromagnetic layer is reduced to 30 Å.

The bottom spin-valve magnetoresistive element of Comparative Example 1 includes the antiferromagnetic layer made of IrMn. This magnetoresistive element generates a larger exchange coupling field between the antiferromagnetic layer and the pinned magnetic layer than the magnetoresistive element of Comparative Example 2 if the thickness of the antiferromagnetic layers is reduced to 90 Å or less. The top spin-valve magnetoresistive element of Example 1 includes the antiferromagnetic layer made of IrMn. This magnetoresistive element generates a larger exchange coupling field between the antiferromagnetic layer and the pinned magnetic layer than the magnetoresistive element of Comparative Example 2 if the thickness of the antiferromagnetic layers is reduced to 80 Å or less.

EXAMPLE 2

GMR magnetic sensing elements were produced to examine variations in exchange coupling field occurring between an antiferromagnetic layer and a pinned magnetic layer in response to changes in the content of Fe in the CoFe alloy for the pinned magnetic layer.

A top spin-valve magnetic sensing element of Example 2 includes a substrate, a seed layer made of NiFeCr and having a thickness of 50 Å, a free magnetic layer including a NiFe film having a thickness of 50 Å and a CoFe film having a thickness of 10 Å, a nonmagnetic material layer made of Cu and having a thickness of 40 Å, a pinned magnetic layer made of $Co_{100-x}Fe_x$ (x is expressed in atomic percent) and having a thickness of 14 Å, an antiferromagnetic layer made of IrMn and having a thickness of 70 Å, and a protective layer made of Ta and having a thickness of 30 Å.

A bottom spin-valve magnetic sensing element of Comparative Example 3 includes a substrate, a seed layer made of NiFeCr and having a thickness of 50 Å, an antiferromagnetic layer made of IrMn and having a thickness of 70 Å, a pinned magnetic layer made of $Co_{100-x}Fe_x$ (x is expressed in atomic percent) and having a thickness of 16 Å, a nonmagnetic material layer made of Cu and having a thickness of 40 Å, a free magnetic layer including a CoFe film having a thickness of 10 Å and a NiFe film having a thickness of 50 Å, and a protective layer made of Ta and having a thickness of 30 Å.

A bottom spin-valve magnetic sensing element of Comparative Example 4 includes a substrate, a seed layer made of NiFeCr and having a thickness of 50 Å, an antiferromagnetic layer made of PtMn, a pinned magnetic layer made of $Co_{90}Fe_{10}$ and having a thickness of 16 Å, a nonmagnetic material layer made of Cu and having a thickness of 40 Å, a free magnetic layer including a CoFe film having a thickness of 10 Å and a NiFe film having a thickness of 50 Å, and a protective layer made of Ta and having a thickness of 30 Å.

Figure 4:
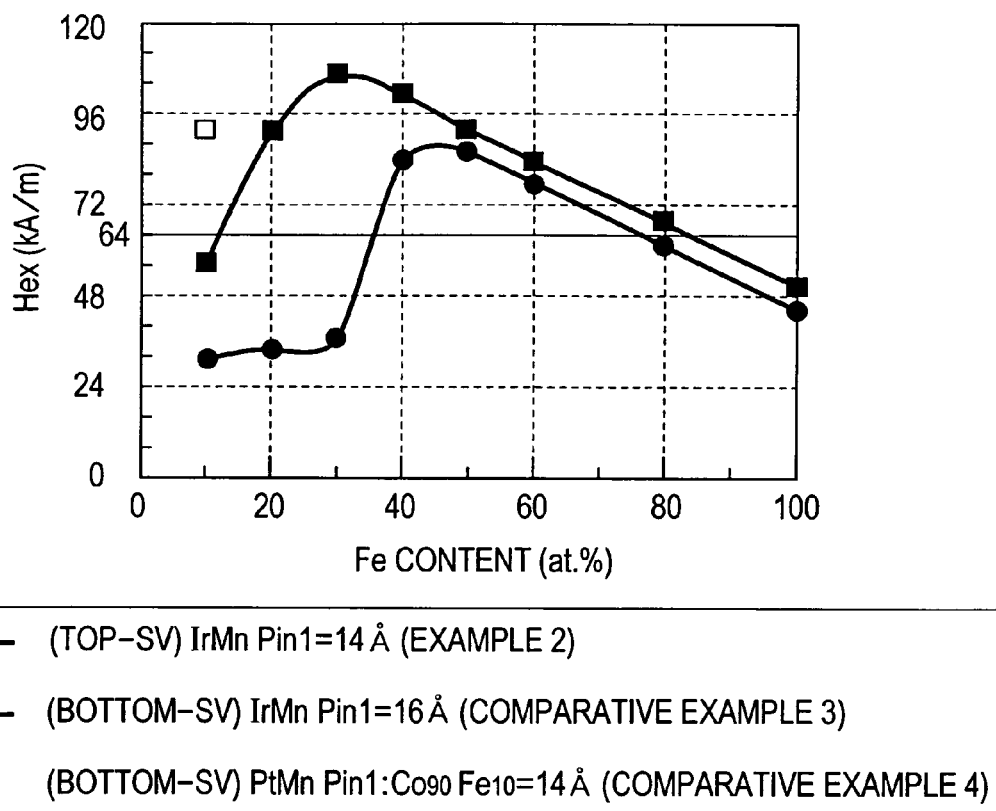
FIG. 4 is a graph showing variations in exchange coupling field occurring between an antiferromagnetic layer and a pinned magnetic layer in response to changes in the content of Fe in the CoFe alloy for the pinned magnetic layer.

The results are shown in FIG. 4. The bottom spin-valve GMR element of Comparative Example 3 has the maximum exchange coupling field between the pinned magnetic layer and the antiferromagnetic layer when the CoFe alloy used for the pinned magnetic layer contains 30 atomic percent of Fe.

On the other hand, the top spin-valve GMR element, in which the antiferromagnetic layer is disposed above the free magnetic layer, has a larger exchange coupling field between the pinned magnetic layer and the antiferromagnetic layer when the CoFe alloy used for the pinned magnetic layer contains 30 atomic percent or more of Fe. The exchange coupling field is maximized when the CoFe alloy contains 40 to 50 atomic percent of Fe.

An excessive content of Fe, however, decreases the exchange coupling field. Accordingly, the content of Fe in the CoFe alloy is adjusted to 90 atomic percent or less in the present invention.

If, additionally, the CoFe alloy used for the pinned magnetic layer contains 35 to 80 atomic percent of Fe, an exchange coupling field of 64 kA/m or more may be achieved between the antiferromagnetic layer and the first magnetic layer.

If, furthermore, the CoFe alloy used for the pinned magnetic layer contains 40 to 60 atomic percent of Fe, an exchange coupling field of 80 kA/m or more may be achieved between the antiferromagnetic layer and the first magnetic layer.

Figure 5:
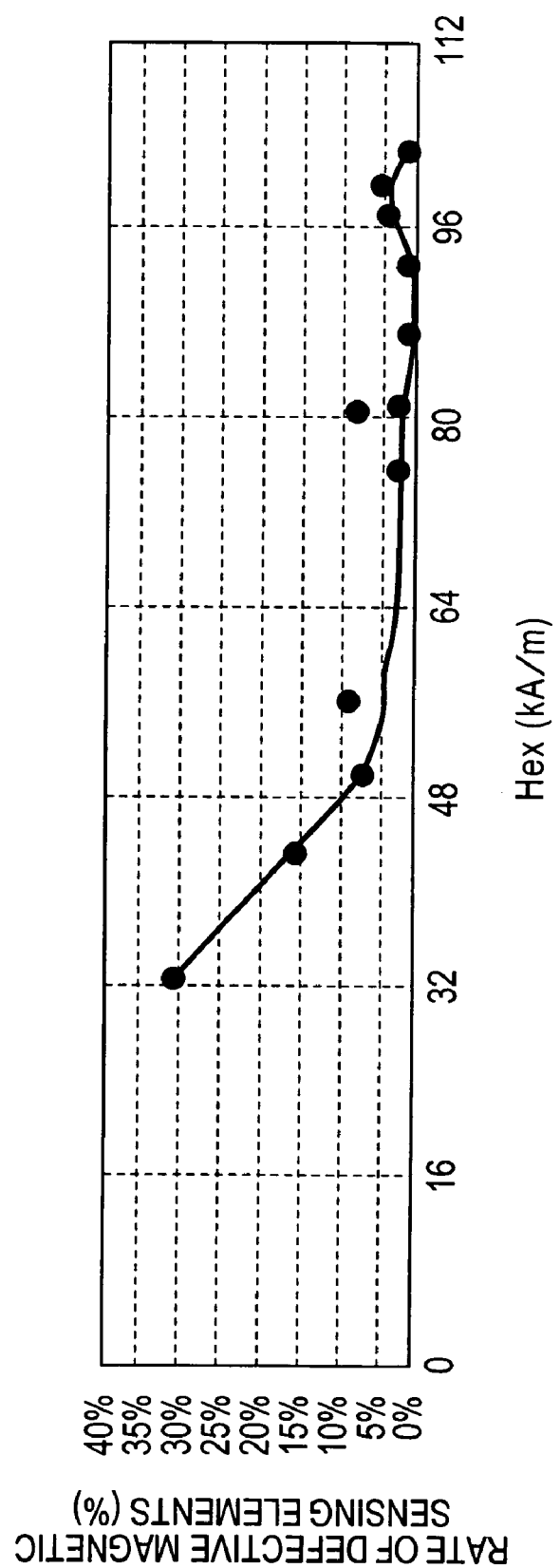
FIG. 5 is a graph showing the relationship between the magnitude of an exchange coupling field occurring between an antiferromagnetic layer and a pinned magnetic layer and the rate of defective magnetic sensing elements.
Figure 6:
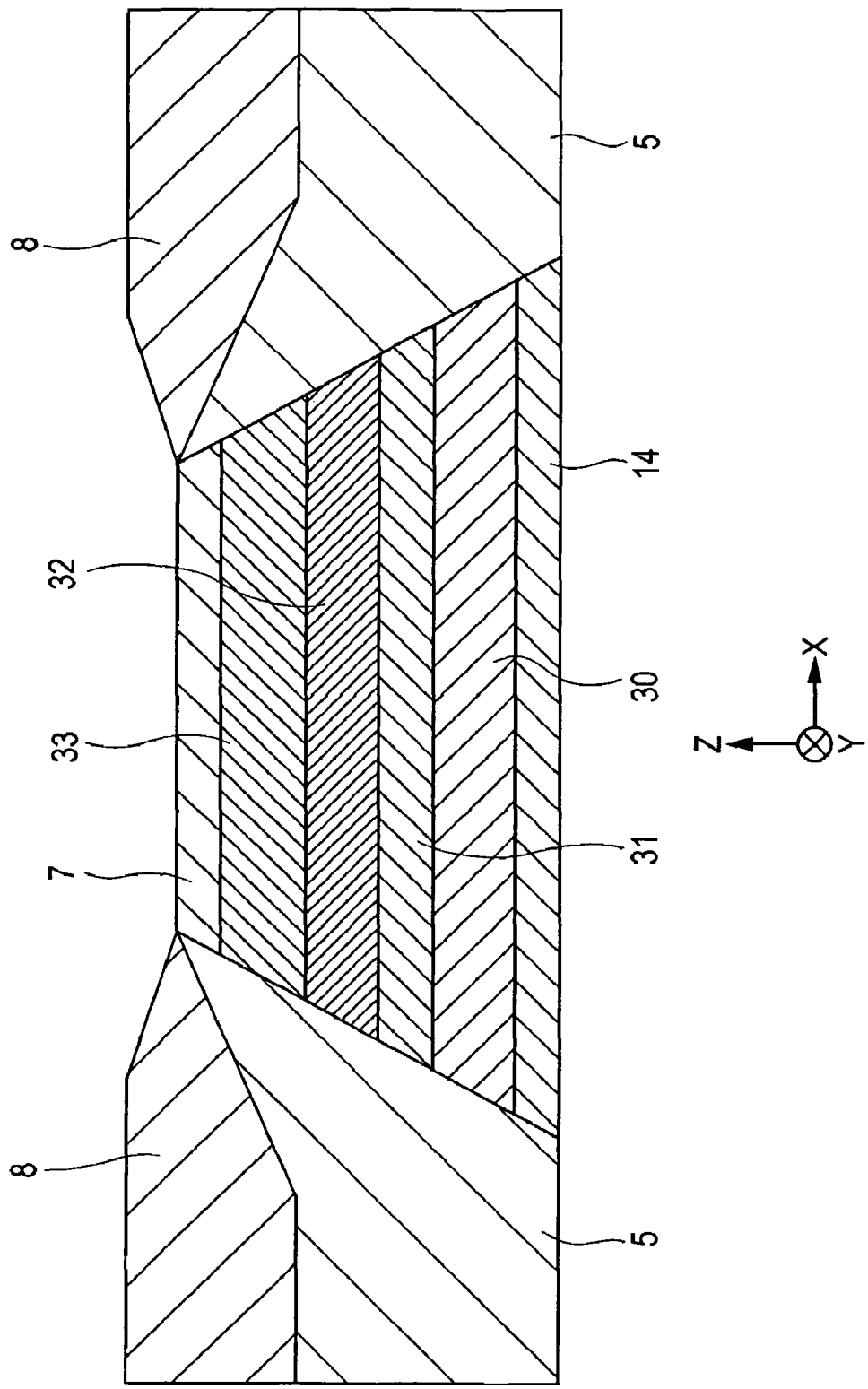
FIG. 6 is a sectional view from the recording medium side of a conventional magnetic sensing element (single spin-valve magnetoresistive element).

FIG. 5 is a graph showing the relationship between the magnitude of an exchange coupling field occurring between an antiferromagnetic layer and a first magnetic layer of a pinned magnetic layer included in a spin-valve GMR magnetic sensing element and the rate of defective magnetic sensing elements in a production process. The rate of defective magnetic sensing elements refers to the percentage of magnetic sensing elements including a pinned magnetic layer with its predetermined magnetization direction inverted in a production process in all magnetic sensing elements. As the exchange coupling field is enhanced, variations in the magnetization direction of the pinned magnetic layer are more significantly inhibited to decrease the rate of defective magnetic sensing elements. In particular, an exchange coupling field of 64 kA/m or more between the antiferromagnetic layer and the pinned magnetic layer results in a rate of defective magnetic sensing elements of 5% or less.

FIG. 4 shows that the composition of the CoFe alloy used for the pinned magnetic layer which maximizes the exchange coupling field is different between the top spin-valve magnetoresistive element, in which the antiferromagnetic layer is disposed above the pinned magnetic layer, and the bottom spin-valve magnetoresistive element, in which the antiferromagnetic layer is disposed below the pinned magnetic layer.

For a dual spin-valve magnetic sensing element as shown in FIG. 2, accordingly, pinned magnetic layers disposed above and below a free magnetic layer are preferably made of CoFe alloys having different compositions.

In the case of the dual spin-valve magnetic sensing element shown in FIG. 2, preferably, the first magnetic layer 33 of the pinned magnetic layer 23 is made of $Co_{100-x}Fe_x$ wherein $10\% \leq x \leq 90\%$ in atomic percent, more preferably $10\% \leq x \leq 30\%$ in atomic percent, and the first magnetic layer 13 of the pinned magnetic layer 3 above the free magnetic layer 1 is made of $Co_{100-x}Fe_x$ wherein $30\% \leq x \leq 90\%$ in atomic percent.

What is claimed is:

1. An exchange coupling film comprising:
   an antiferromagnetic layer formed on a ferromagnetic layer; the ferromagnetic layer is in direct contact with the antiferromagnetic layer from below the antiferromagnetic layer; and
   an exchange coupling field occurring between the two layers to align magnetization of the ferromagnetic layer in a predetermined direction, wherein
   the antiferromagnetic layer comprises IrMn with a thickness ranging from 30 to 80 angstroms and has an Ir content ranging from 15 to 30 atomic percent; and
   at least an interfacial portion of the ferromagnetic layer which is adjacent to the antiferromagnetic layer comprises $Co_{100-x}Fe_x$ wherein $40\%<x \leq 90\%$ in atomic percent.

2. The exchange coupling film according to claim 1, wherein at least the interfacial portion of the ferromagnetic layer which is adjacent to the antiferromagnetic layer comprises $Co_{100-x}Fe_x$ wherein $40\%<x \leq 80\%$ in atomic percent.

3. The exchange coupling film according to claim 2, wherein at least the interfacial portion of the ferromagnetic layer which is adjacent to the antiferromagnetic layer comprises $Co_{100-x}Fe_x$ wherein $40\%<x \leq 60\%$ in atomic percent.

4. The exchange coupling film according to claim 1, wherein the antiferromagnetic layer has a thickness of 30 to 80 Å.

5. A magnetic sensing element comprising, from the bottom, a free magnetic layer, a nonmagnetic material layer, a pinned magnetic layer, and an antiferromagnetic layer, magnetization of the free magnetic layer being aligned in a direction orthogonal to a magnetization direction of the pinned magnetic layer,
   wherein the pinned magnetic layer and the antiferromagnetic layer comprise the exchange coupling film according to claim 1.

6. The magnetic sensing element according to claim 5, wherein the free magnetic layer has a multilayer ferrimagnetic structure including a first magnetic layer, a second magnetic layer, and a nonmagnetic intermediate layer disposed therebetween.

7. A magnetic sensing element comprising:
   a free magnetic layer;
   an upper nonmagnetic material layer disposed on a top side of the free magnetic layer;
   a lower nonmagnetic material layer disposed on a bottom side of the free magnetic layer;
   an upper pinned magnetic layer disposed on a top side of the upper nonmagnetic material layer;
   a lower pinned magnetic layer disposed on a bottom side of the lower nonmagnetic material layer;
   an upper antiferromagnetic layer disposed on a top side of the upper pinned magnetic layer; and
   a lower antiferromagnetic layer disposed on a bottom side of the lower pinned magnetic layer, wherein magnetization of the free magnetic layer is aligned in a direction orthogonal to a magnetization direction of the upper and lower pinned magnetic layers, and the upper antiferromagnetic layer and the upper pinned magnetic layer include an exchange coupling field occurring between the two layers to align magnetization of the upper pinned magnetic layer in a predetermined direction, and the upper and lower antiferromagnetic layers comprises IrMn with a thickness ranging from 30 to 80 angstroms and has an Ir content ranging from 15 to 30 atomic percent.

8. The magnetic sensing element according to claim 7, wherein
   the lower antiferromagnetic layer comprises IrMn; and
   at least an interfacial portion of the lower pinned magnetic layer which is adjacent to the lower antiferromagnetic layer comprises $Co_{100-x}Fe_x$ wherein $10\% \leq x \leq 90\%$ in atomic percent.

9. The magnetic sensing element according to claim 8, wherein
   the lower antiferromagnetic layer comprises IrMn; and
   at least the interfacial portion of the lower pinned magnetic layer which is adjacent to the lower antiferromagnetic layer comprises $Co_{100-x}Fe_x$ wherein $10\% \leq x \leq 30\%$ in atomic percent.

10. The magnetic sensing element according to claim 7, wherein
   the upper pinned magnetic layer has a multilayer ferrimagnetic structure including a first magnetic layer adjacent to the upper antiferromagnetic layer, a second magnetic layer, and a nonmagnetic intermediate layer disposed between the first and second magnetic layers; and
   the upper antiferromagnetic layer and the first magnetic layer comprise an exchange coupling film.

* * * * *